United States Patent [19]

Mehta et al.

[11] Patent Number: 5,250,347
[45] Date of Patent: Oct. 5, 1993

[54] MECHANICALLY ENHANCED, HIGH IMPACT STRENGTH TRIAZINE RESINS, AND METHOD OF PREPARING SAME

[75] Inventors: Ashit A. Mehta; Tyan M. Niu, both of Vestal; Lee P. Springer, Endicott; William J. Summa, Endwell, all of N.Y.; Lee P. Wilding, New Milford, Pa.

[73] Assignee: International Business Machines Corporation, Armonk, N.Y.

[21] Appl. No.: 848,772

[22] Filed: Mar. 10, 1992

[51] Int. Cl.$^5$ ................................. B32B 3/00
[52] U.S. Cl. ........................ 428/209; 428/327; 428/411.1; 428/901; 174/250; 361/748
[58] Field of Search ............... 428/209, 411.1, 901, 428/327; 528/422; 174/250; 361/397

[56] References Cited

U.S. PATENT DOCUMENTS

| | | | |
|---|---|---|---|
| 4,709,008 | 11/1987 | Shimp | 528/422 |
| 4,740,584 | 4/1988 | Shimp | 528/422 |
| 4,745,215 | 5/1988 | Cox et al. | 560/301 |
| 4,784,901 | 11/1988 | Hatakeyama et al. | 428/268 |
| 4,970,276 | 11/1990 | Das et al. | 525/504 |
| 5,089,660 | 2/1992 | Murray et al. | 560/301 |
| 5,108,825 | 4/1992 | Wojnarowski et al. | 428/209 |
| 5,206,074 | 4/1993 | Davis et al. | 428/209 |

OTHER PUBLICATIONS

Principles of Electronic Packaging p. 351 edited by Donald P. Seraphim et al. (1989).
Printed Circuits Handbook 3rd ed. chapter 32.2 edited by Clyde F. Coombs, Jr. (1988).

Primary Examiner—Patrick J. Ryan
Assistant Examiner—Marie R. Macholl
Attorney, Agent, or Firm—Richard M. Goldman

[57] ABSTRACT

Disclosed are filled poly(triazine) resin dielectrics and microelectronic circuit packages incorporating them. In the filled poly(triazine) dielectric composites, dispersed thermoplastic polymeric fillers are used to reduce the brittleness and increase the ductility of the triazine polymer, while preserving the low dielectric constant of the triazine host matrix-based composite.

5 Claims, 2 Drawing Sheets

MECHANICALLY ENHANCED, HIGH IMPACT STRENGTH TRIAZINE RESINS, AND METHOD OF PREPARING SAME

FIELD OF THE INVENTION

This invention relates to the use of triazine resin dielectrics in microelectronic circuit packages, for example, to replace epoxy resins.

The triazine resins are the polymerization product of, for example, the reaction:

dicyanate→triazine.

According to one emplification of the invention dicyanate diphenyl hexafluoro isopropane, $NCO—C_6H_4—C_3F_6—C_6H_4—OCN$ is suitably initiated to form the highly cross-linked polymer poly (symmetrical-triazine). Alternatively, the triazine polymer may be a polymeric reaction product of (1) a first dicyanate having the formula $NCO—R_1—OCN$, and (2) a second dicyanate having the formula $NCO—R_2—OCN$, where the R's are independently aromatics or aliphatics. In a preferred exemplification $R_1$ is diphenyl hexafluoroisopropane, $—C_6H_4—((CF_3)C(CF_3))—C_6H_4—$ and $R_2$ is bisphenol M, $—C_6H_4—((CH_3)C(CH_3))—C_6H_4—((CH_3)C(CH_3))—C_6H_4—$.

The resulting triazine polymer has a low dielectric constant, and is chemically resistant to processing. Thus, the polymer could be used as a dielectric material in multi-layer electronic circuit packages, that is, in an analogous manner to FR-4 polyepoxide.

However, the use of triazine polymers as dielectrics has been limited because of the mechanical properties heretofore associated with triazine polymers. Specifically, triazines are brittle. Triazines fracture and microcrack during such processing steps as drilling, punching, and thermal cycling.

A further drawback of triazines is that when used with particulate or fibrous fillers, for example, glass cloth or aramid fibers, the dielectric constant is increased to the range of 3.2 to 3.5. This is unsatisfactory for high clock speed microelectronic circuit packages.

According to the invention, dispersed thermoplastic polymeric fillers are used to reduce the microcracking and increase the fracture toughness of the triazine polymer, while preserving the low dielectric constant of the triazine host matrix-based composite. The fillers that maintain the dielectric constant below approximately 2.8, while increasing ductility include, solely by way of exemplification and not limitation, UPILEX-R BPDA-ODA, UPILEX-S BPDA-PDA, TEFLON MP-1000, and TEFLON FLUO 300.

BACKGROUND OF THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, New York, (1988), and Rao R. Tummala and Eugene J. Rymaszewski, *Microelectronic Packaging Handbook*, Van Nostrand Reinhold, New York, New York (1988), both of which are hereby incorporated herein by reference.

Electronic packages extend from the integrated circuit chip, through the module, card, and board, to the gate and system. The integrated circuit "chip" is referred to as the "zero order package." This chip or zero order package enclosed within its module is referred to as the first level of packaging. The integrated circuit chip provides circuit component to circuit component and circuit to circuit interconnection, heat dissipation, and mechanical integrity.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip, and consequently, multiple chips are required to perform the function. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electromechanical switches, optical couplers, and the like. Fourth, the second level package provides for thermal management, i.e., heat dissipation. Several cards may, in turn, be mounted on one board.

Cards and boards may be polymer based or ceramic based. A basic process for polymer based composite package fabrication is the "prepreg" process described by George P. Schmitt, Bernd K. Appelt and Jeffrey T. Gotro, "Polymers and Polymer Based Composites for Electronic Applications" in Seraphim, Lasky, and Li, *Principles of Electronic Packaging*, pages 334–371, previously incorporated herein by reference, and by Donald P. Seraphim, Donald E. Barr, William T. Chen, George P. Schmitt, and Rao R. Tummala, "Printed Circuit Board Packaging" in Tummala and Rymaszewski, *Microelectronics Packaging Handbook*, pages 853–922, also previously incorporated herein by reference.

In the "prepreg" process for polymeric electronic circuit package fabrication, a fibrous body, such as a non-woven mat or woven web, is impregnated with a laminating resin, i.e., an adhesive. This step includes coating the fibrous body with, for example, an epoxy resin solution, evaporating the solvents associated with the resin, and partially curing the resin. The partially cured resin is called a B-stage resin. The body of fibrous material and B stage resin is the prepreg. The prepreg, which is easily handled and stable, may be cut into sheets for subsequent processing.

Typical resins used to form the prepreg include epoxy resins, cyanate ester resins, polyimides, hydrocarbon based resins, and fluoropolymers. One type of prepreg is the FR-4 prepreg. FR-4 is a fire retardant epoxy-glass cloth material, where the epoxy resin is the diglycidyl ether of 2,2′-bis(4-hydroxyphenyl) propane. This epoxy resin is also known as the diglycidyl ether of bisphenol-A, (DGEBA). The fire retardancy of the FR-4 prepreg is obtained by including approximately 15–20 weight percent bromine in the resin. This is done by incorporating the appropriate amount of resins or other brominated compounds.

Still other bisphenol-A diglycidyl ether resins are used to form rigid circuit boards. Among the resins so used to produce "prepreg" for reinforced laminate compositions for circuit boards are the lower molecular weight bisphenol A diglycidyl ether epoxy resins, including bromine-substituted resins for imparting some degree of flame resistance as disclosed by U.S. Pat. No. 4,782,116. Such epoxy resins are of relatively low equivalent weight, in the area of 180 to 200, using non brominated resin for example, so that the epoxy group content is relatively high, i.e., each relatively short repeating unit contains two epoxy groups, which results in an increase in the dielectric constant of the compositions after curing.

Other epoxy resin formulations useful in providing prepregs include high functionality resins, such as epoxidized cresol novolacs, and epoxidized derivatives of tris (hydroxyphenyl) methane. The multifunctional epoxy resins are characterized by high glass transition temperatures, high thermal stability, and reduced moisture up take.

Phenolic cured epoxies, as Ciba-Giegy RD86-170 ™, Ciba-Giegy RD87-211 ™, Ciba-Giegy RD87-212 ™, Dow Quatrex® 5010 ™, Shell Epon® 1151 ™, and the like, are also used in forming prepregs. These epoxies are mixtures of epoxies, with each epoxy having a functionality of at least 2, a phenolic curing agent with a functionality of at least 2, and an imidazole catalyst.

Cyanate ester resins are also used in forming prepregs. One type of cyanate ester resin includes dicyanates reacted with methylene dianiline bis-maleimide. This product may also be reacted with compatible epoxides to yield a three component laminate material. One such laminate material is a 50:45:5 (parts by weight) of epoxy:cyanate:maleimide. Typical of cyanate ester resins useful in forming prepregs is the product of bisphenol-A dicyanate and epoxy, which polymerizes during lamination to form a crosslinked structure.

Another class of dielectric substrates are film-adhesive systems. These differ from the above described fiber-resin systems by the use of an adhesive bearing film. Both the adhesive and the film must be carefully selected and matched. This is because of the tendency of the two to separate. One polyimide used for the film to carry the adhesive in a film-adhesive system, is a polyimide based on diphenylene dianhydride, described in U.S. Pat. No. 4,725,484 to Kiyoshi Kumagawa, Kenji Kuniyasu, Toshiyuki Nishino, and Yuji Matsui for DIMENSIONALLY STABLE POLYIMIDE FILM AND PROCESS FOR PREPARATION THEREOF.

Some proposed adhesive mixtures contain substantial amounts of the epoxy resin relative to the dicyanate polymer(s), producing an even higher dielectric constant. Also in such compositions the glass transition temperature and processing or curing temperature generally are reduced to such an extent that the thermal stability of the cured prepregs or laminates is unsatisfactory for high temperature processing applications.

However, the presently known film-adhesive systems and fiber-adhesive systems suffer from shortcomings. For example, epoxy-glass systems have a relatively high dielectric constant, and relatively poor thermal stability, while polyimide-glass systems have a poor copper peel strength. Attempts to substitute polymeric fibers or films for the glass fibers have introduced problems of microcracking and poor mechanical properties.

Triazine polymers, both homo-polymers and copolymers have similar processability to FR-4 polyepoxide. Thus, potentially, triazine polymers could be used as a dielectric material in multi-layer electronic circuit packages in an analogous manner to FR-4 polyepoxide.

However, the use of triazine polymers as dielectrics has been limited because of their poor mechanical properties. Specifically, triazines are brittle. Triazines fracture and microcrack during such processing steps as drilling, punching, and thermal cycling.

A further drawback of polymerized dicyanates is that when used with particulate or fibrous fillers, for example, glass cloth or aramid fabrics, the dielectric constant is increased to the range of 3.2 to 3.5. This is unsatisfactory for high clock speed microelectronic applications.

OBJECTS OF THE INVENTION

Thus, it is one object of our invention to provide a polymeric triazine dielectric having a low dielectric constant, high thermal stability, and increased resistance to microcracking for microelectronic circuit packages.

Another object of our invention is to provide a low dielectric constant, thermally stable composite of a triazine for microelectronic circuit packages.

A still further object of our invention is to provide a free standing triazine film by vacuum lamination.

SUMMARY OF THE INVENTION

According to the method and composition of the invention, dispersed thermoplastic polymeric fillers are used to reduce brittleness and impart microcracking resistance to triazine, while preserving the low dielectric constant of the triazine host matrix. Exemplary fillers included aromatic polyimides and linear poly fluorocarbons. The fillers that maintained the dielectric constant below approximately 2.8, while increasing ductility included: UPILEX-R BPDA-ODA, UPILEX-S BPDA-PDA, TEFLON MP-1000, and TEFLON FLUO 300.

The circuit package of the invention has a dispersed polymer reinforced, low dielectric poly (triazine) core, with surface circuitization on at least one exterior surface. The surface circuitization is adapted to receive an integrated circuit. The poly(triazine) may be a symmetrical, homopolymeric polymerization product of, for example, dicyanate diphenyl hexafluoro isopropane. Alternatively, the poly(triazine) may be a copolymer, for example, a copolymer of (1) a first dicyanate having the formula NCO—$R_1$—OCN, and (2) a second dicyanate having the formula NCO—$R_2$—OCN, where the R's are different moieties chosen from the group consisting of aromatics and aliphatics. Thus, in one alternative embodiment one of $R_1$ and $R_2$ is diphenyl hexafluoroisopropane, —$C_6H_4$—$((CF_3)C(CF_3))$—$C_6H_4$— and the other of $R_1$ and $R_2$ is bisphenol M, —$C_6H_4$—$((CH_3)C(CH_3))$—$C_6H_4$—$((CH_3)C(CH_3))$—$C_6H_4$—.

The filler is a dispersed, low dielectric constant polymer, such as a poly-tetrafluoroethylene type polymer, or a polyimide. Exemplary polyimides include aromatic polymeric reaction products of (1) biphenylenetetracarboxylic dianhydride and (2) an aromatic diamine, such as (a) p-phenylene diamine or (b) diamino phenylene oxide.

According to a further exemplification of the invention there is provided a tough, microcracking resistant, low dielectric constant composite of (a) a triazine, such as poly[symmetrical (dicyanate diphenyl hexafluoro isopropane) triazine], and (b) a low dielectric constant, dispersed, polymeric filler.

THE FIGURES

The invention may be understood by reference to the figures.

DETAILED DESCRIPTION OF THE INVENTION

Figure 1:
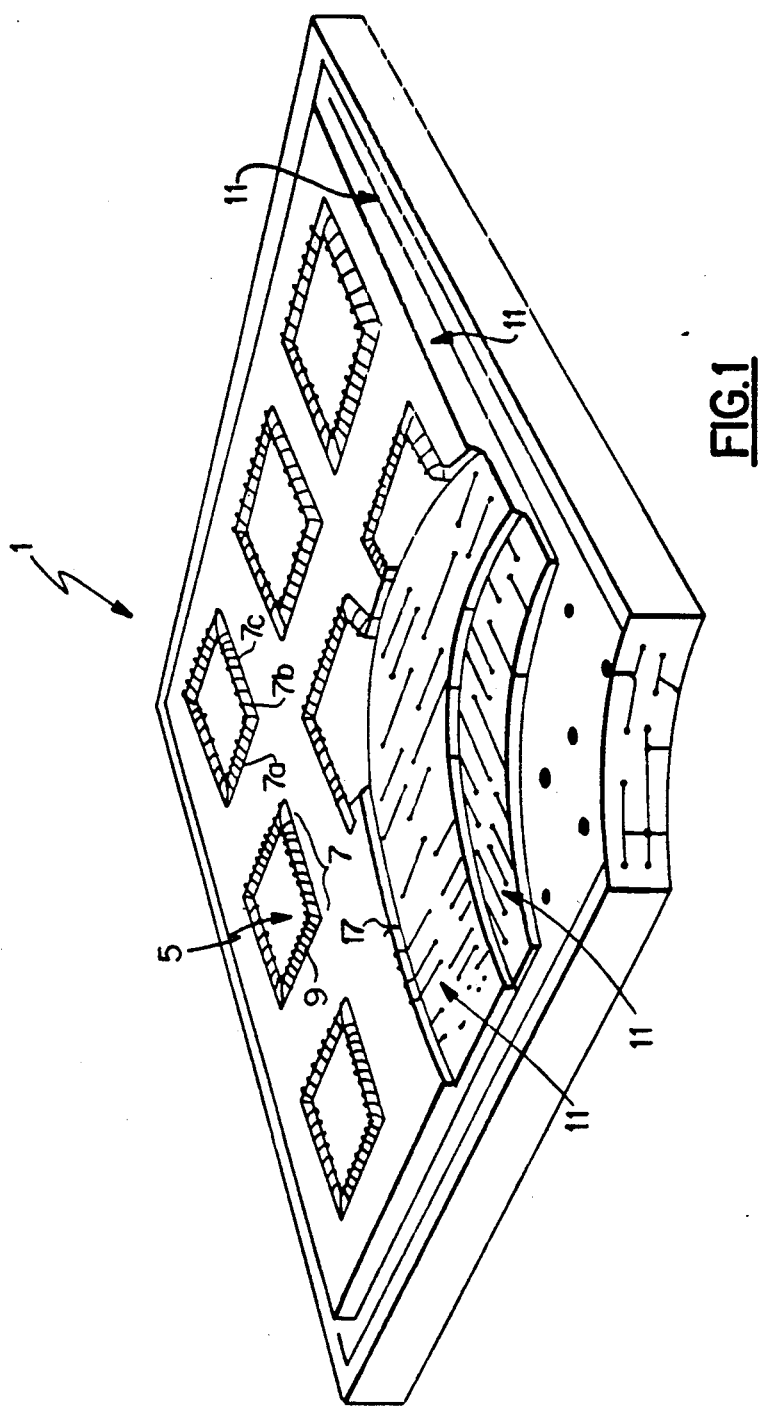
FIG. 1 is an isometric view, in partial cutaway, of a microelectronic circuit package incorporating the organic polymeric dielectric of the invention.

Triazine resins are particularly desirable dielectric substrates for electronic circuit packages. Triazines are produced by the reaction 3 dicyanate ⟶ tri(azine),

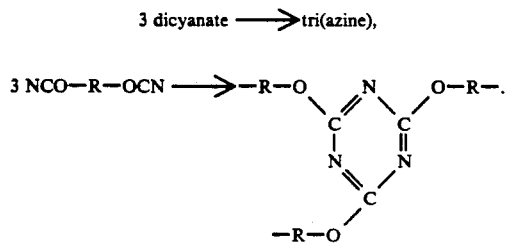

One reason for the desirability of poly (triazines) is that, like epoxy resins, poly (triazines) process through a B-stage. This is a particulalr advantage in processing. Moreover, the preferred poly (triazines) of the invention have outstanding high temperature properties, i.e., a glass transition temperature, $T_g$, of 250° Centigrade to 290° Centigrade. The preferred poly (triazines) also have desirable electrical properties, such as a reasonably low dielectric constant, $E_r$, of 2.6 to 3.0.

One serious shortcoming of poly(triazine) resins is that cross-linked poly (triazine) networks tend to be brittle. As a result, they fracture and microcrack during processing, i.e., during drilling, punching, and thermal cycling. Moreover, attempts to remedy the brittleness with glass cloth result in an increased dielectric constant, $E_r$, of 3.2 to 3.5.

According to the invention, a thermoplastic filler is dispersed in a triazine percursor, which is then polymerized. The incorporation of a thermoplastic filler in the triazine precursor, and the polymerization of the triazine with the dispersed filler results in a poly (triazine) matrix characterized by high resistance to cracking, especially during such operations as punch pressing. The preferred fillers are thermally stable fillers that do not materially increase the dielectric constant of the composition. Exemplary fillers are polyimides and polyfluorocarbons.

According to the method, structure, and composition of the invention, dispersed thermoplastic polymeric fillers are used to reduce brittleness and impart microcracking resistance to triazine, while preserving the low dielectric constant of the triazine host matrix. Exemplary fillers included polyimides, especially aromatic polyimides, and polyfluorocarbons, especially aliphatic polyfluorocarbons.

The circuit package of the invention has a core formed of dispersed thermoplastic polymer filled and reinforced, low dielectric constant, poly (triazine) core, with surface circuitization on at least one exterior surface. The surface circuitization is adapted to receive an integrated circuit.

The poly(triazine) may be a symmetrical, homopolymeric polymerization product of dicyanate diphenyl hexafluoro isopropane.

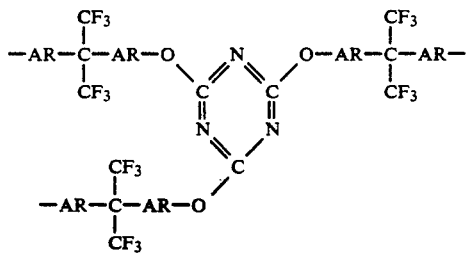

where AR represents $C_6H_4$.

Alternatively, the poly(triazine) may be a copolymer, for example, a copolymer of (1) a first dicyanate having the formula NCO—$R_1$—OCN, and (2) a second dicyanate having the formula NCO—$R_2$—OCN, where the R's are different moieties chosen from the group consisting of aromatics and aliphatics. Thus, in one alternative embodiment one of $R_1$ and $R_2$ is diphenyl hexafluoropropane, —$C_6H_4$—(($CF_3$)C($CF_3$))—$C_6H_4$— and the other of $R_1$ and $R_2$ is bisphenol M, —$C_6H_4$—(($CH_3$)C($CH_3$))—$C_6H_4$—(($CH_3$)C($CH_3$))—$C_6H_4$—.

The filler is a dispersed, low dielectric constant polymer, such as a poly-fluorocarbon, or a polyimide. The preferred fillers have a low enough dielectric constant to maintain the dielectric constant of the composite below approximately 3.0, while increasing the crack resistance of the resulting composite. Polyimide fillers meeting these criteria are generally reaction products of (1) tetracarboxylic dianhydrides and (2) aromatic diamines. Particularly preferred polyimide fillers are particles and fibers formed of copolymers of a. 3,3',4,4'- biphenylenetetracarboxylic dianhydride; and b. either 4,4'-diaminophenyloxide or p-phenylene diamine.

This copolymer has the structure represented by:

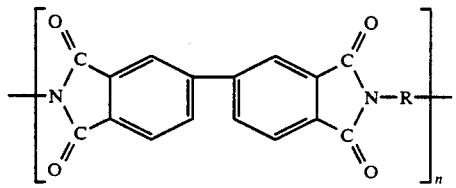

where R is

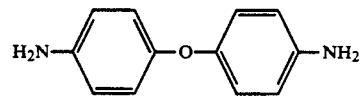

or

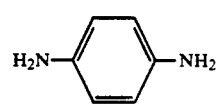

These polyimides include UPILEX-R BPDA-ODA, UPILEX-S BPDA-PDA.

Polyfluorocarbon fillers meeting these criteria include TEFLON MP-1000, and TEFLON FLUO 300.

The filler may be in the form of spherical particles, as particles having a mass average particle size of about 5 microns to about 15 microns.

The loading of the filler is from about 5 weight percent to about 45 weight percent of the composite.

The composite is particularly useful as a layer in a multi-layer printed circuit card or board used in electronic packaging. For example, the printed circuit board or card, 1, shown in FIG. 1, and also referred to as an electronic circuit package, is capable of and adapted to receive at least one microelectronic integrated circuit chip, 5. The IC chip, 5, has leads, 7, for example, signal leads, 7a, a power lead, 7b, and a ground lead, 7c, communicating with corresponding circuit elements in the circuit package, 1, through a chip carrier, 9. The circuit package, 1, is a laminate of individual cores, 11, at least one layer or core 11 comprising a substrate of the above described organic polymeric dielectric composite. Individual layers, 11, of the package 1 may carry power cores, buried signal circuitization, or external signal circuitization 17.

Figure 2:
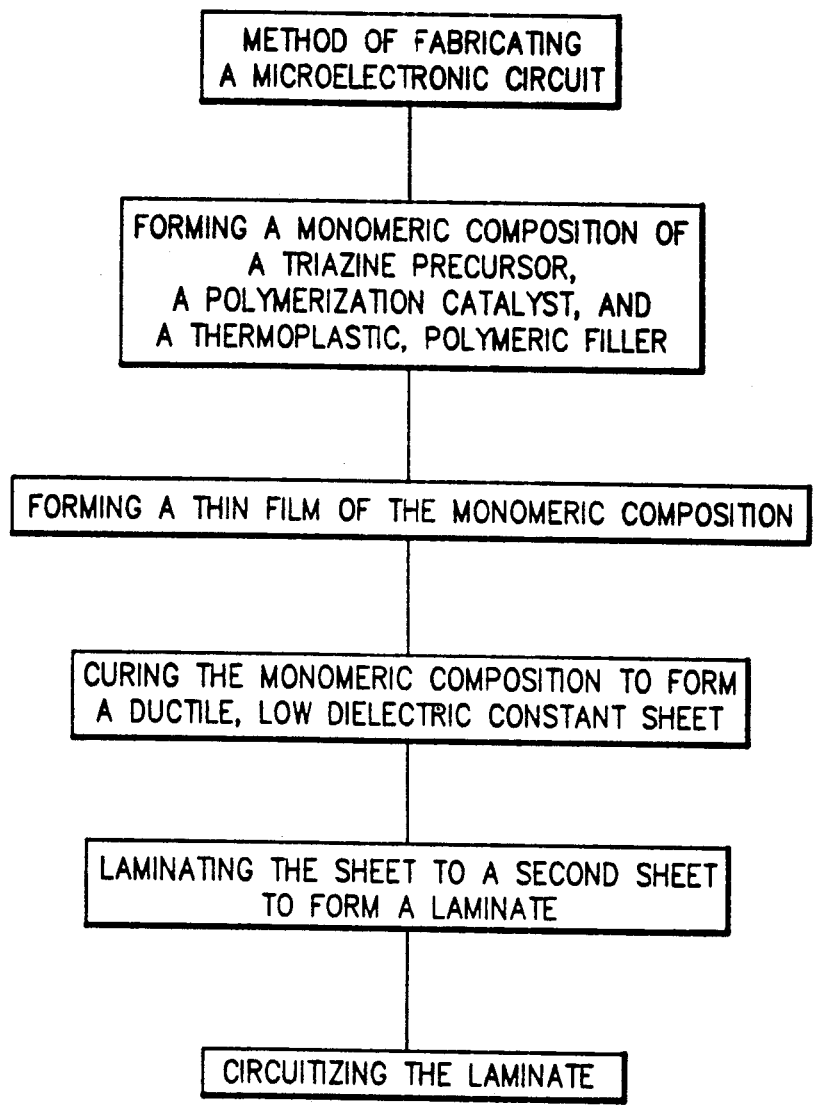
FIG. 2 is a flow chart of a method for fabricating a microelectronic circuit package incorporating the organic polymeric dielectric of the invention.

According to a still further exemplification of the invention, illustrated in the flow chart of FIG. 2, there is provided a method of fabricating a circuit board layer for incoproration in a multi-layer circuit board or card. The method includes the steps of providing an organic polymeric film, that is, a poly (triazine) film. The polytriazine film is formed by forming a monomeric or pre-polymeric (e.g., a B stage resin) composition of triazine precursors, filler, and polymerization catalyst in a solvent.

The starting composition may be a monomeric or prepolymeric (B-stage resin) composition of, solely by way of illustration and not limitation, 100 parts of monomer, polymer, or B-stage resin, such as AROCY 6F, about 0.5 to about 1.5 parts polymerization catalyst, as Zinc Octoate, in about 75 to about 125 parts of a solvent, as methyl ethyl ketone (concentrations are based on 100 parts of triazine precursor). About 5 to 45 parts of filler particles are then added to the composition, and stirred with a high shear mixer.

The monomeric or prepolymeric (B-stage resin) composition may be applied to a suitable substrate, including a fibrous body or mat, or to a sacrificial substrate, for example, by dipping, spraying, or otherwise coating the substrate. Alternatively the substrate, or a fibrous body to be coated is fed through a dip tank or bath of the triazine precursors, filler, solvent, and polymerization catalyst. A drying step may be carried out at this time.

Where the coating is to be applied to a metal core to form a metal core package, the coated sacrificial substrate is vacuum laminated to a metal foil, i.e., the core, and the sacrificial substrate is peeled away. Lamination may be repeated several times to build up a thick layer of laminated material.

After the desired coating thickness is attained, the material is cured to form a poly (triazine) matrix. The matrix may be a B-stage resin or a substantially cross-linked matrix. Polymerization may be carried out by heating the composition hot enough to react the monomeric constituents of the triazine and form a pre-polymer (B-stage resin), or a substantially fully cross-linked matrix. Pressing or even lamination can be combined with polymerization. Thus, the monomer, pre-polymer, or B-stage resin, may be polymerized in a lamination press.

Lamination and curing may, alternatively, be carried out in multiple steps, for example in a two-step process, such as 30 minutes at 200 degrees Centigrade followed by 35 minutes at 250 to 300 degrees Centigrade. Typically, curing is done at elevated temperature, e.g., at a time—temperature program including heating the laminate or composite to 200 degrees Centigrade and maintaining the laminate or composite at 200 degrees Centigrade for ten minutes to an hour, and therafter heating the laminate or composite to 300 degrees Centigrade and maintaining the laminate or composite at 300 degrees Centigrade for ten minutes to an hour or longer. In this way substantially complete cross linking is achieved. Throughout this time the laminate is maintained under pressure.

It is to be noted that the cure may be partial, to obtain a partially cross-linked resin, i.e., a "B-stage" resin, which may be mechanically worked, laminated, and cured.

According to an alternative exemplification of the invention, a thin sheet of the filled triazine dielectric is formed These sheets may be built up to form a free standing film of the filled triazine. In this alternative embodiment, the polytriazine film is formed by forming a monomeric or pre-polymeric (B-stage resin) composition of triazine precursors, filler, and polymerization catalyst in a solvent.

The monomeric or pre-polymeric composition may be applied to a web, as a fiberglass web or a polymeric web, by drawing the web through a tank of the monomeric or pre-polymeric material, or by spraying the web with monomeric or pre-polymeric material. Preferably the web is formed of a low dielectric constant material as poly-tetrafluoroethylene. A drying step may be carried out at this time. The monomer or pre-polymer bearing web is then drawn through curing means to form a pre-preg. A plurality of filled poly (triazine) resin pre-preg sheets, optionally with adhesive between the individual sheets, are laminated at elevated temperature and pressure to form a substrate, e.g., a free standing substrate.

The B-stage resin may be polymerized to cross link the poly (triazine) in a lamination press at an applied pressure of about 300 pounds per square inch to about 500 pounds per square inch.

Subsequent steps include core lamination, power core circuitization, buried signal circuitization, panel lamination, external circuitization, and application of contacts. It is of course to be understood that circuitization and lamination are carried out in various sequences to form power cores, internal circuitization, external circuitization, and contacts, leads, and housings.

According to an alternative embodiment of our invention, a free-standing film of poly (triazine) may be prepared. For example, according to this alternative embodiment of our invention, one or both sides of a polyimide film, as a film of a copolymer of 3,3',4,4'-biphenylenetetracarboxylic dianhydride and p-phenylene diamine (commercially known as Upilex ® S), with a dicyanate precursor of poly (triazine). The opposite surface, or surfaces, of the dicyanate precursor of poly (triazine) may then be coated, for example with a Cu foil, or with a Mylar ® film.

The dicyanate precursor of poly (triazine) is then held in compression, for example by drawing a vacuum on bearing surfaces, and heated to form a product of a sticky, gummy film. The Upilex ® film peeled away, leaving a Cu-poly(triazine) laminate. Alternatively, where the dicyanate has been coated with a Mylar ® film, the Mylar ® and Upilex ® films can be peeled away, leaving a free standing poly(triazine) film. The poly(triazine) film can be used to form an adhesive between sheets of Cu foil, or to build up a thick film of poly (triazine).

While the invention has been described with respect to certain preferred embodiments and exemplifications, it is not intended to limit the scope of the invention thereby, but solely by the claims appended hereto.

We claim:

1. An electronic circuit package having surface circuitization adapted to receive an integrated circuit on at least one surface thereof, and a core comprising a composite dielectric of (1) poly (triazine) and (2) from 5 to 45 weight percent of a dispersed, thermoplastic, particulate, polymeric filler having a particle size of 5 to 15 microns and chosen from the group consisting of (a) polyimide polymers of tetracarboxylic dianhydride and aromatic diamine, and (b) polyfluorocarbons, said composite dielectric having a dielectric constant below 3.0.

2. The electronic circuit package of claim 1 wherein the poly(triazine) is a polymerization product of dicyanate diphenyl hexafluoro isopropane.

3. The electronic circuit package of claim 1 wherein the poly(triazine) is a copolymer of (1) a first dicyanate having the formula NCO—$R_1$—OCN, and (2) a second dicyanate having the formula NCO—$R_2$—OCN, where the R's are different moieties.

4. The electronic circuit package of claim 3 wherein the R's are independently chosen from the group consisting of aromatics and aliphatics.

5. The electronic circuit package of claim 4 wherein one of $R_1$ and $R_2$ is diphenyl hexafluoro isopropane, and the other of $R_1$ and $R_2$ is bisphenol M.

* * * * *